(12) United States Patent
Yang

(10) Patent No.: US 8,413,102 B2
(45) Date of Patent: Apr. 2, 2013

(54) VECTORLESS IVD ANALYSIS PRIOR TO TAPEOUT TO PREVENT SCAN TEST FAILURE DUE TO VOLTAGE DROP

(75) Inventor: Wen-Chieh Jeffrey Yang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/197,146

(22) Filed: Aug. 3, 2011

(65) Prior Publication Data
US 2013/0036394 A1 Feb. 7, 2013

(51) Int. Cl.
*G06F 9/455* (2006.01)
*G06F 17/50* (2006.01)

(52) U.S. Cl. .......................... 716/136; 716/133

(58) Field of Classification Search .................. 716/133, 716/136
See application file for complete search history.

(56) References Cited

U.S. PATENT DOCUMENTS

| | | | |
|---|---|---|---|
| 7,480,810 B2 | 1/2009 | Gonzalez | |
| 7,693,676 B1 * | 4/2010 | Keller et al. | 702/118 |
| 7,752,578 B2 | 7/2010 | Allen | |
| 7,904,844 B2 | 3/2011 | Chang et al. | |
| 2003/0212538 A1 * | 11/2003 | Lin et al. | 703/14 |
| 2003/0212973 A1 * | 11/2003 | Lin et al. | 716/6 |
| 2004/0230414 A1 | 11/2004 | Hoppe | |
| 2005/0028119 A1 * | 2/2005 | Frenkil | 716/6 |
| 2007/0044063 A1 | 2/2007 | Faour | |
| 2008/0052654 A1 * | 2/2008 | Rahmat et al. | 716/6 |
| 2008/0072112 A1 * | 3/2008 | Varadarajan et al. | 714/738 |
| 2010/0095179 A1 * | 4/2010 | Wen et al. | 714/738 |
| 2010/0146350 A1 * | 6/2010 | Lin et al. | 714/738 |

OTHER PUBLICATIONS

Debnath, et al: "Design for Manufacturability and Reliability in Nano Era;" 2009 22nd International Conference on VLSI Design; Jan. 2009; New Delhi, India.
Lin, et al: "Full-chip Vectorless Dynamic Power Integrity Analysis and Verification Against 100uV/100ps-Resolution Management;" Custom Integrated Circuits, Conference, 24-8, Oct 2004.
Whitepaper: "Power Noise Analysis for Next Generation ICs;" Apache Design Solutions; 2009; http://www.apache-da.com.

* cited by examiner

*Primary Examiner* — Suresh Memula
(74) *Attorney, Agent, or Firm* — Lawrence J. Merkel; Meyertons, Hood, Kivlin, Kowert & Goetzel, P.C.

(57) ABSTRACT

In one embodiment, a vectorless IVD methodology may be used to estimate IVD issues for an integrated circuit earlier in the design cycle of the integrated circuit, e.g. when corrective actions may still be taken to correct IVD failures. In the methodology, scan chains for various clusters in the integrated circuit may be identified, even though the scan chains may still be subject to change as the design evolves. A power integrity tool may analyze the scan chains based on a probability of transitions in the devices within the scan chain (e.g. flops) for a theoretical worst-case test vector. If the result of analysis identifies IVD failures in the clusters, corrective action may be taken such as modifying the design. Alternatively, the corrective action may include identifying one or more flops that experience failure as devices to be excluded from the test vector generation process for scan testing.

12 Claims, 4 Drawing Sheets

| Scanning in a One | |
|---|---|
| Transition | Probability |
| 0 -> 0 | 0 |
| 0 -> 1 | 0.5 |
| 1 -> 0 | 0 |
| 1 -> 1 | 0.5 |

20

| Scanning in a Zero | |
|---|---|
| Transition | Probability |
| 0 -> 0 | 0.5 |
| 0 -> 1 | 0 |
| 1 -> 0 | 0.5 |
| 1 -> 1 | 0 |

22

VECTORLESS IVD ANALYSIS PRIOR TO TAPEOUT TO PREVENT SCAN TEST FAILURE DUE TO VOLTAGE DROP

BACKGROUND

1. Field of the Invention

This invention is related to integrated circuit design methodology and, more particularly, to ensuring testability of the integrated circuit in manufacture.

2. Description of the Related Art

As semiconductor fabrication technology continues to reduce the size of transistors fabricated on an integrated circuit "chip," the number of transistors included on a given integrated circuit continues to increase. The increase in the number of transistors increases the likelihood that a given instance of the integrated circuit may have a manufacturing flaw that prevents the integrated circuit from operating as designed. Additionally, the reduced size of the transistors also decreases the minimum size of a flaw that can cause incorrect operation.

To avoiding shipping a flawed integrated circuit to a customer, various schemes to test the integrated circuit during manufacturing (e.g. at the foundry which implements the fabrication process) are often used. For example, scan testing can be used to detect flaws that cause a given signal in the integrated circuit to be "stuck at" a given binary value (i.e. the signal is unable to switch to the opposite binary value even when the circuitry generating the signal should logically cause such a switch). Such scan testing is typically performed at a relatively low clock frequency (e.g. compared to the clock frequency at which the integrated circuit will operate). Another type of scan testing is transition testing, which tests if transitions in the logic state in a clocked storage device (such as a flop) can propagate through the logic circuitry to be captured at a receiving clocked storage device. Transition testing is typically conducted at expected operating frequencies (although the shifting portion of the test can be conducted at lower frequencies).

An additional issue that requires analysis in the design of integrated circuits is the integrity of the power supply. As the number of transistors in the integrated circuit increases, the potential for power supply droop to be an issue increases as well. That is, the impedance characteristics of the power supply distribution interconnect in the integrated circuit, and even the package impedance effects, coupled with localized high current loads due to switching can cause local droop in the magnitude of the supply voltage. Such droops can slow the operation of the circuitry, and even cause functional failure. Testing for such voltage droop conditions is referred to as instance voltage drop (IVD) testing.

Scan testing typically involves shifting a pattern of binary zeros and ones into the clocked storage devices of the integrated circuit, clocking one or more functional clocks to capture state change in the clocked storage devices, and shifting out the captured state to compare against expected state. The testing operations can cause switching noise and voltage droop on the power supply, since the circuitry connected to the clocked storage devices reacts to the shifting states. In some cases, the voltage droop can be severe enough that incorrect operation occurs. If incorrect operation occurs due to voltage droop, then the circuitry that experiences the voltage droop cannot be tested successfully.

The procedures to generate the test patterns for scan testing are long latency, and thus are typically only performed at or near tapeout of an integrated circuit design, when the scan chains are essentially finalized. Once the test patterns (also called "test vectors") are generated, the vectors may be applied to the circuit design in a power integrity tool to check for IVD issues. Accordingly, IVD testing often occurs months after the tapeout, when it is no longer possible to make changes to the current integrated circuit design. Changes must wait for a subsequent tapeout, or in the case that the tapeout is for production, changes are no longer possible for that design.

An exemplary power integrity tool may be the RedHawk™ tool from Apache Design Solutions, Inc. (San Jose, Calif.). The RedHawk™ tool supports vector-based IVD analysis using the above test vectors. The RedHawk™ tool also supports a vectorless mode in which the tool analyzes IVD without test vectors. However, the vectorless mode required input and changes from the inventor of this application in order to work correctly for the methodology described below.

SUMMARY

In one embodiment, a vectorless IVD methodology may be used to estimate IVD issues for an integrated circuit earlier in the design cycle of the integrated circuit, e.g. when corrective actions may still be taken to correct IVD failures. In the methodology, scan chains for various clusters in the integrated circuit may be identified, even though the scan chains may still be subject to change as the design evolves. A power integrity tool may analyze the scan chains based on a probability of transitions in the devices within the scan chain (e.g. flops) for a theoretical worst-case test vector. If the result of analysis identifies IVD failures in the clusters, corrective action may be taken such as modifying the design. Alternatively, the corrective action may include identifying one or more flops that experience failure as devices to be excluded from the test vector generation process for scan testing.

Because the methodology is vectorless, the lengthy test vector generation process and its associated delays may be avoided. While the analysis may be based on a theoretical worst-case test vector that might not actually be generated in the test vector generation process, IVD issues that are detected using the methodology are at least possible in the test vectors and thus could be issues that present problems during the testing of the actual integrated circuit chips. Accordingly, through the early identification and correction of such issues, better testability of the integrated circuit may be realized in some embodiments.

BRIEF DESCRIPTION OF THE DRAWINGS

The following detailed description makes reference to the accompanying drawings, which are now briefly described.

Figures 1, 2:
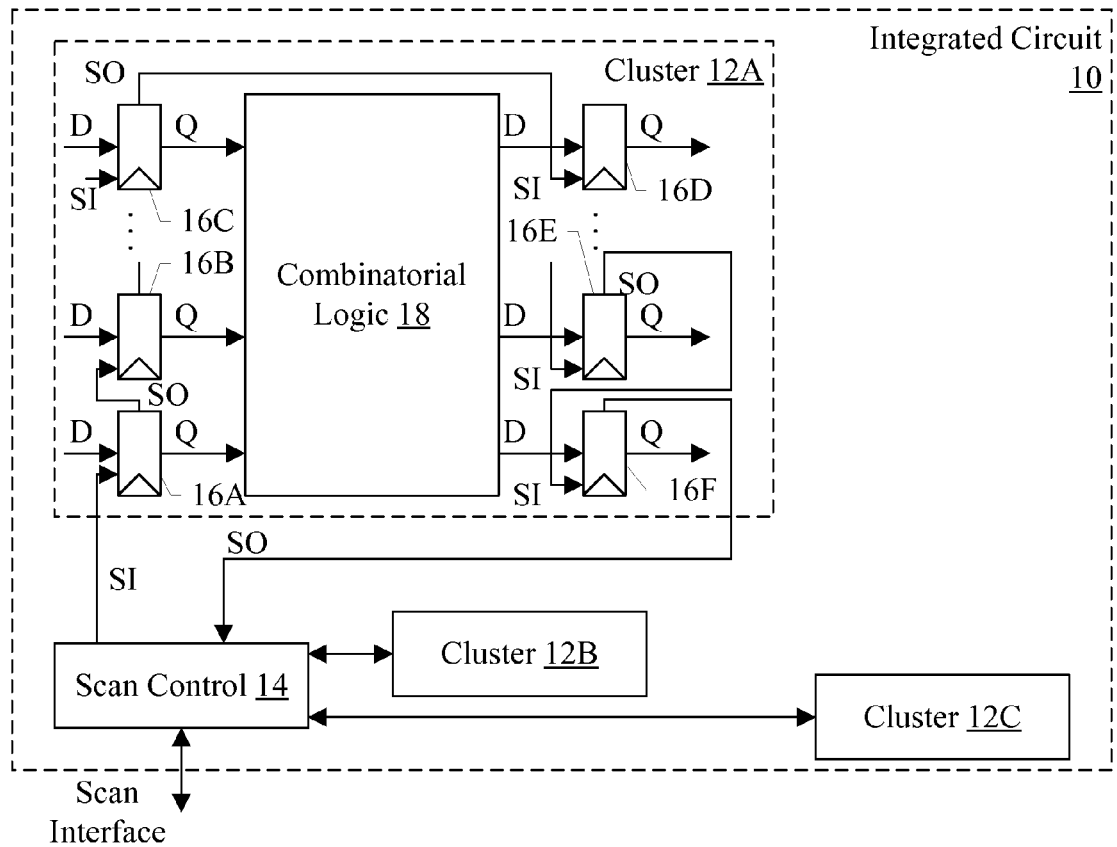
FIG. 1 is a block diagram of one embodiment of an integrated circuit.
FIG. 2 is a table illustrating probabilities of certain switching events in a clocked storage device during scan.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit 10 is shown. In the illustrated embodiment, the integrated circuit 10 includes multiple circuit clusters 12A-12C coupled to a scan control circuit 14. The scan control circuit 14 is coupled to an external scan interface. The scan interface may be compatible with an industry standard interface such as the test access port (TAP) described in the Institute of Electrical and Electronic Engineers (IEEE) specification 1149.1 and/or 1500, or may be an interface defined by the designers of the integrated circuit 10. Each cluster 12A-12C may include one or more scan chains, beginning with a scan in signal (SI) from the scan control circuit 14 to the cluster 12A-12C and ending with a scan out (SO) signal from the cluster 12A-12C to the scan control circuit 14. For example, one scan chain for the cluster 12A is shown in FIG. 1, although a given cluster may have multiple scan chains.

Generally, a cluster may be a group of circuits that are physically located near each other. For example, a cluster may be a block defined by the designers, that has a specified functionality and inputs and outputs that connect to other blocks. Alternatively, a block may include multiple clusters. An exemplary cluster 12A is shown in more detail in FIG. 1. Other clusters 12B-12C may be similar.

The cluster 12A may include various clocked storage devices such as devices 16A-16F, as well as combinatorial logic circuit 18. Generally, a clocked storage device may be any device that is configured to capture a value and retain that value responsive to a clock signal. For example, the clocked storage devices may include registers, flip-flops (or more briefly flops), latches, etc. Flops will be used as an example herein, but any other form of clocked storage devices may be used. The combinatorial logic circuit 18 may include any type of logic circuitry designed to evaluate within a clock cycle of the clock controlled the flops 16A-16F (e.g. static logic circuitry, dynamic logic circuitry, custom logic circuitry, etc.).

In the illustrated embodiment, the flops 16A-16C may be inputs to the combinatorial logic circuit 18 (and there may be more inputs, as illustrated by the ellipses in FIG. 1). Similarly, the flops 16D-16F may capture outputs of the combinatorial logic block (and there may be more outputs captured in flops, as illustrated by the ellipses in FIG. 1). Alternatively, there may be fewer inputs and/or outputs.

In order to test the integrated circuit 10, various states may be loaded into the flops 16A-16C, the flops may be clocked (capturing corresponding outputs in the flops 16D-16F), and the corresponding states may be unloaded from the flops 16D-16F and compared to expected results. Such tests are referred to as scan capture tests. Additionally, the flops may be clocked twice (with appropriate setup test vectors) to detect transitions propagating through the flops and combinatorial logic. Such tests are referred to as scan transition tests. The loading and unloading of the flops may be performed at low speed, and the capture/transition clock cycles may be performed at operating speed to test timing paths. Alternatively, the capture/transition clock cycles may be performed at low speeds to test for functionality, even if timing requirements are not met.

The flops 16A-16F are connected together to form a scan chain via the scan in and scan out (SI and SO) signals. That is, the scan in signal of each flop in the chain may be connected to the scan out signal of another flop in the chain, forming a serial connection of flops that may operate similar to a shift register in scan mode. The scan in signal of the first flop in the chain (flop 16A) may be connected to the scan in signal from the scan control circuit 14. The scan out signal of the last flop in the change (flop 16F) may be the scan out signal to the scan control circuit 14. Responsive to input on the scan interface, the scan control circuit 14 may assert a scan enable signal (not shown in FIG. 1) to the flops to enable scan shifting. Data may be shifted through the chain to load the flops with a test vector. Then, the scan enable may be deasserted to permit one or more clock cycles of evaluation and capture, followed by assertion of the scan enable to shift out the results for checking. The scan input data may be provided over the scan interface to the scan control circuit 14, and the scan control circuit 14 may provide the scan output data over the scan interface as well.

In addition to the above tests, a scan shift test may be used to check the functionality of the flops and the scan chain itself, by shifting data through the chain and expecting to receive the same data at the output. The scan shift test may be performed first when an integrated circuit is fabricated, and if the test passes, other scan tests such as capture and transition tests may be performed. Generally, any of the scan shift, scan capture, and scan transition tests may be referred to as a scan test. The input data (and optionally the expected data) may be referred to as a test vector or test pattern. Test vector generation tools may be used to generate the test vectors, detecting how much coverage the test vectors provide for the tested circuitry and continuing to generate patterns to improve the coverage.

IVD Methodology

The IVD methodology described herein may avoid the lengthy generation of test vectors and simulation of the design using the test vectors in favor of a vectorless analysis of switching. For example, the analysis may be based on a probability of a state transition occurring in the flops in a cluster. The probabilities may be based on using a worst-case test vector, or a vector that would appear to be worst-case. The measurement of worst-case in this context may generally refer to a vector that causes the most switching activity in the combinatorial logic circuit 18. That is, a worst-case test vector may generate the most switching activity in the combinatorial logic circuit 18. Nearly worst-case vectors may generate greater switching activity than other vectors. When switching activity is high, large amounts of current are drawn from the power supply and thus the voltage droop experienced at various localized points within the cluster may be at its highest. Absent a specific analysis of the combinatorial logic circuit 18, it may not be possible to definitively identify a worst-case vector, but certain vectors have a high likelihood of generating significant switching activity. For example, a vector that repeatedly transitions from zero to one (i.e. . . . 10101010 . . . (in binary)) may generate significant switching activity as it is shifted through the scan chain. A vector of . . . 001100110011 . . . (again, in binary) may also be a vector that generates significant switching activity and may be a worst case vector, e.g., for scan capture testing. Any vector may be represented as a set of probabilities for the IVD methodology herein.

Based on approximate physical location of the flops 16A-16F and combinatorial logic circuitry 18, the power integrity tool may identify areas that may experience IVD issues. An IVD issue may be a drop in supply voltage in the area that may cause the circuitry to operate more slowly than desired, potentially leading to an IVD failure. An IVD failure may occur when the circuitry fails to operate as expected, even though the circuitry is not faulty. For example, the operation may slow so much that timing is not met even at a lower-frequency scan clock. Alternatively, the voltage may drop to a point that certain circuits do not reliably operate due to threshold voltages of the transistors not being overcome when the transistors should be turning on, due to contention between transistors, etc.

The IVD analysis may be based on probabilities, and may not require actual test vector generation (i.e. vectorless). Thus, the analysis may be performed relatively quickly, and need not be performed on the final design database. That is, the flops and the scan chain configurations may still be subject to change when the IVD analysis is performed. Thus, the IVD analysis may be performed earlier in the design cycle. For example, the analysis may be performed prior to tapeout. More generally, the IVD analysis may be performed any time that the design description is available.

The IVD analysis may detect localized voltage drop failures/issues. That is, a relatively fine-grain analysis of the power grid at small points within the grid. For example, the points may be smaller than the clusters 12A-12C. More particularly, areas of the size of a few flops (e.g. 10 or less) and related combinatorial logic circuitry may be detected.

FIG. 2 is a pair of tables 20 and 22 that illustrate probabilities that may be provided to the power integrity tool to perform the vectorless IVD analysis. Any power integrity tool may be used in various embodiments. For example, the RedHawk™ tool mentioned above may be used. Generally, a power integrity tool may be a software program which, when executed, is configured to analyze a circuit design to identify potential power supply issues such as IVD issues in the design.

Table 20 illustrates the probability of generating a transition in a flop when scanning a binary one into the flop. The current state of the flop is not known, but it is known that the next state will be a binary one. Accordingly, the probabilities for transitioning from 0 to 0, and from 1 to 0, are both zero because the next state is known to be a 1. The probabilities of transition from 0 to 1, and from 1 to 1, are both 0.5 (as each current state is equally likely, and the next state is known to be a one). Similarly, table 22 illustrates the probabilities for scanning a binary zero into a flop. In this case, the probability of a 0 to 0 transition and a 1 to 0 transition are both 0.5, and the probability of a 0 to 1 transition and a 1 to 1 transition are both zero.

By applying the probabilities illustrated in tables 20 and 22 in a vectorless IVD analysis, significant switching activity (and possibly worst case, or near worst case, switching activity) may be simulated to identify potential IVD issues/failures. The analysis may be run earlier in the process, e.g. prior to tapeout of the integrated circuit 10. Tapeout may generally refer to the release, to the foundry that is to fabricate the integrated circuit 10, of data describing the masks to be used to manufacture the integrated circuit 10.

For example, a vector of alternating ones and zeros may be modeled by applying the probabilities of table 20 to one flop, the probabilities of table 22 to a next flop in the chain, the probabilities of table 20 to the following flop to the next flop in the chain, etc. That is, the probabilities may be alternated as the chain is traversed. Other test vectors may be modeled by assigning different sets of probabilities to the flops. For example, a vector of . . . 001100110011 . . . may be modeled by applying the probabilities of table 20 to two consecutive flops in the chain, applying the probabilities of table 22 to the next two consecutive flops in the chain, etc.

Figure 3:
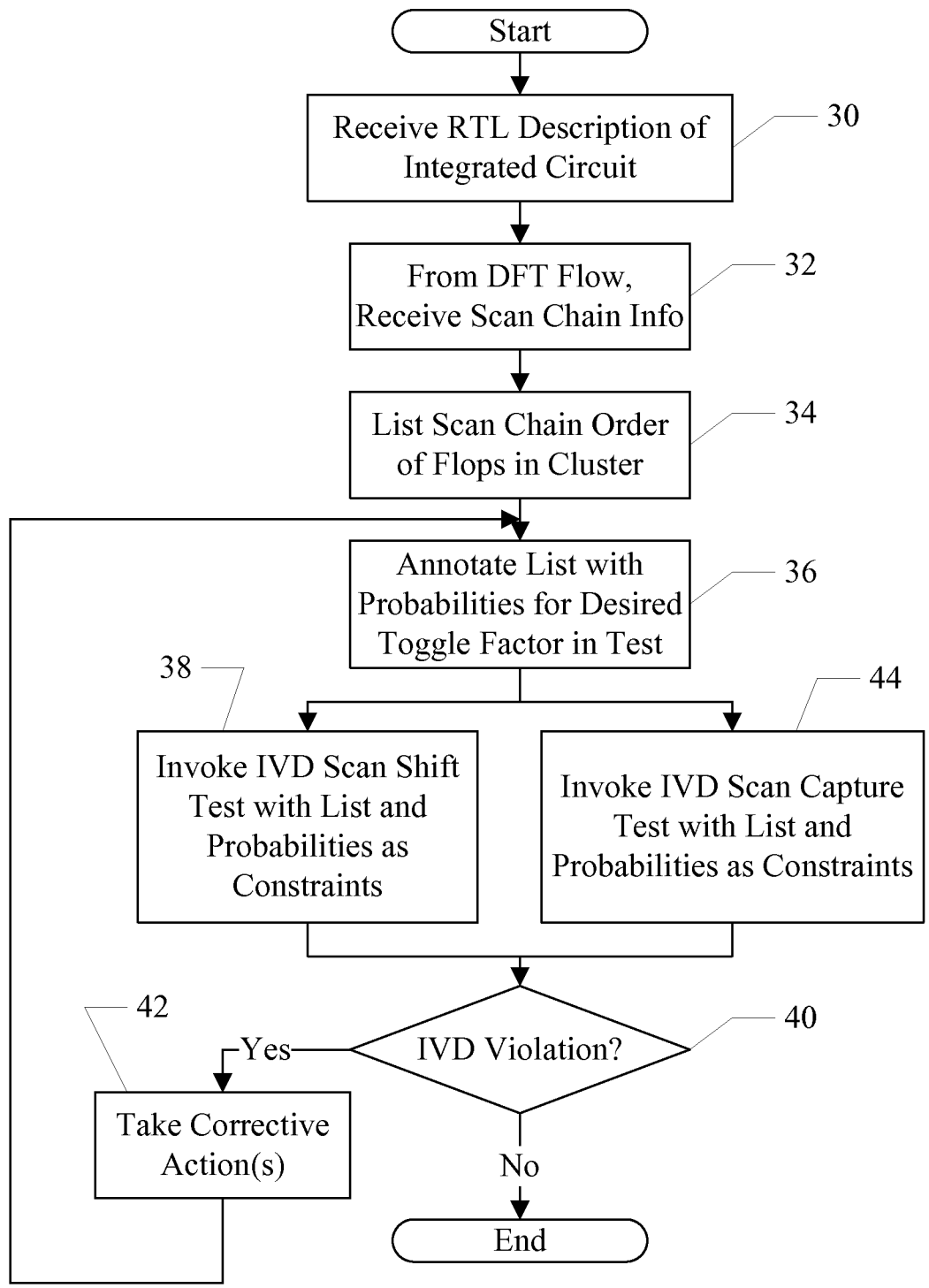
FIG. 3 is a flowchart illustrating one embodiment of a methodology for detecting IVD issues for scan testing.

Turning now to FIG. 3, a flowchart illustrating one embodiment of the IVD methodology is shown. Parts of the flowchart may be implemented in various software programs. The programs may be instructions which, when executed on a processor in a computer, cause the described operation to occur in the computer. The instructions may be directly executed on the computer system under control of controlling software such as an operating system, a virtual machine hypervisor, or virtual machine monitor (e.g. binary executable code). Alternatively, indirectly executed code such as shell scripts, Java code, etc. that is interpreted by software may be used. Any combination of indirectly and directly executed code may be used. Various software programs may also be referred to as tools below. The operations illustrated in FIG. 3 may be performed prior to tapeout, as previously mentioned. While the blocks are shown in FIG. 3 in a particular order, other orders may be used and blocks may be performed in parallel (e.g. blocks 38 and 44 as illustrated).

A description of the integrated circuit 10 may be received by a constraint control tool that is configured to generate control input to the power integrity tool (block 30). In this embodiment, the description may be a register-transfer level (RTL) description. An RTL description may be expressed in a hardware design language (HDL) such as VHDL or Verilog, which may be synthesizable to produce the integrated circuit 10. Alternatively, the RTL description may model operation of a corresponding custom circuit design or custom-designed block. In such a case, the flops may match between the RTL description and other descriptions, and the logic circuitry may be Boolean equivalents between the RTL description and the custom design. The RTL description may specify the flops 16A-16F in the integrated circuit 10, and may also specify the combinatorial logic 18 in terms of logic equations and other HDL-supported constructs. Other descriptions/representations may also be used. Such descriptions/representations may include schematics, netlists, layout descriptions, etc.

The constraint control tool may also receive scan chain information from the design for test (DFT) flow (block 32). The scan chain information may specify the interconnections of the flops 16A-16F to form scan chains, including the order of the connections. The scan chain information may be based on automatic scan insertion, manual scan insertion, or a combination of the two. The scan chain information may be provided, e.g., as one or more files to the constraint control tool.

The constraint control tool may list the scan chain order of the flops within each cluster (block 34). That is, the list may be an ordered list of flops for each scan chain. Thus, as the list is traversed, the flops in a given scan chain are traversed in order from beginning to end, followed by another scan chain in order, etc.

The constraint control tool may annotate the list with the probabilities for the desired toggle factor in the test (e.g. according to the tables 20 and 22 in FIG. 2) (block 36). For example, to simulate the switching of a vector that alternates ones and zeros consecutively, a flop may be assigned the probabilities in table 20, the next flop in the chain may be assigned the probabilities in table 22, the following flop may be assigned the probabilities in table 20 again, etc. Other vectors may be similarly be modeled by annotating the probabilities into the list. In some embodiments, the flexibility for modeling vectors via probabilities annotated into the list may permit significant variation in the testing, allowing for robust testing for IVD failures at an early stage in the design cycle.

The constraint control tool may invoke the power integrity tool to perform the IVD analysis for a scan shift test with the annotated list as constraints (block 38). The constraint control tool may also invoke the power integrity tool to perform the IVD analysis for a scan capture test with the annotated list as constraints (block 44). That annotated list for the scan shift test may differ from the annotated list for the scan capture test. However, the scan shift and scan capture tests are independent and may be performed in parallel or in either order. In one embodiment, if the scan shift test with an alternating one and zero vector passes (no IVD violations detected), the scan capture test may be skipped as the scan capture test may often have less switching activity. If the result of either test is an IVD violation (decision block 40, "yes" leg), corrective actions may be taken (block 42), and the analysis may be repeated. Still further, in some embodiments, IVD analysis for a scan transition test may be invoked (not shown).

An IVD violation may be detected in a variety of ways. For example, a threshold value or values may be established for the acceptable amount of voltage drop. If the threshold is exceeded, and IVD issue/failure may be identified. If two or more thresholds are defined, potential trouble areas may be highlighted along with failures detected for the highest threshold (largest drop).

The output of the operations illustrated in FIG. 3 may include information identifying the IVD failures/issues. For example, the information may include a list or other identification of the affected clocked storage devices. The information may include a visual representation of the integrated circuit 10 (e.g. a floorplan) with color coding or other visual indicia identifying locations of failures/issues. Any mechanism for conveying the information may be used.

Figure 4:
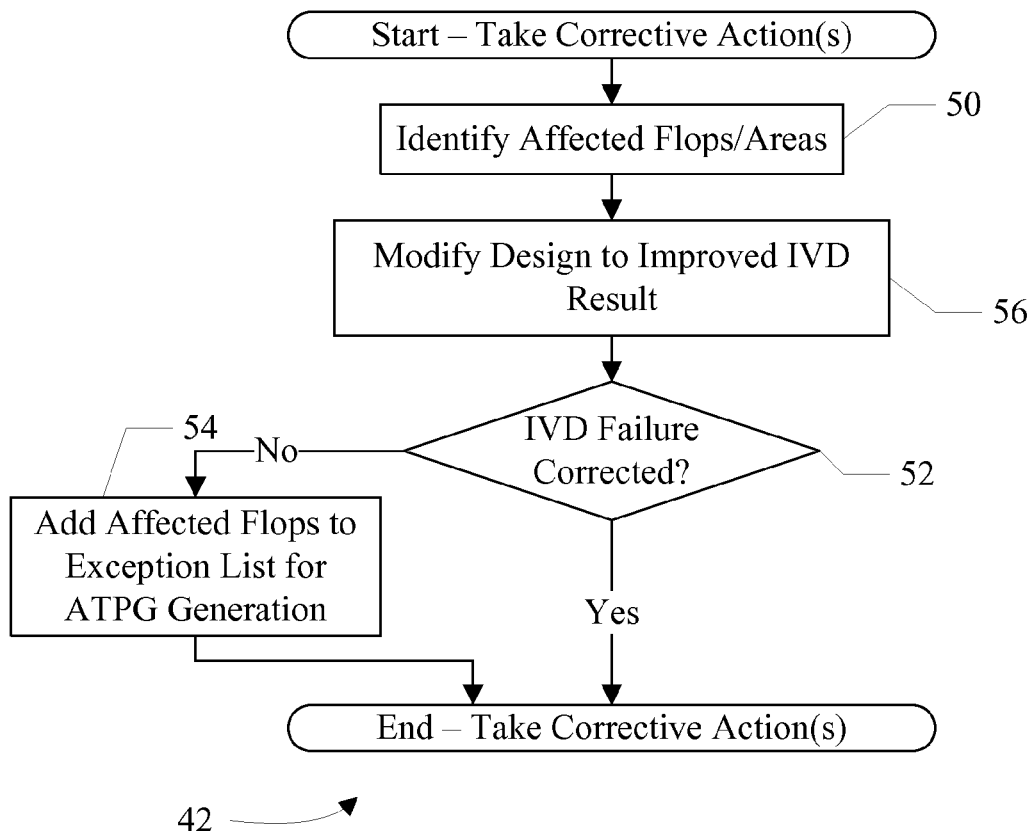
FIG. 4 is a flowchart illustrating one embodiment of a block shown in FIG. 3 in greater detail.

Various corrective actions may be taken in various embodiments. Generally, the corrective actions may be any actions which attempt to improve the identified IVD issues/failures and/or prevent those identified issues/failures from impacting the testability of the integrated circuit 10. For example, FIG. 4 is a flowchart illustrating one embodiment of the corrective measures that may be taken (block 42 in FIG. 3).

The constraint control tool may identify the flops affected by the IVD issue/failure (block 50). The affected flops may be those that experience voltage drops that exceed the threshold levels discussed above. Alternatively, areas of the integrated circuit 10 in which IVD failures were detected may be identified. The IVD issue/failure information may be provided to the designer(s), who may modify the design of the integrated circuit 10 to improve the IVD result (block 56). For example, the designers may modify the power grid design, enforce power striping, spread the placement of flops and logic circuitry in the area, etc. If, after performing design modification efforts, there are still IVD failures/issues (decision block 52, "no" leg), the constraint control tool may add the affected flops to an exclusion list for automatic test program generation (ATPG) (block 54). The affected flops may be added to the exclusion list if the number of affected flops is less than a threshold number, for example. ATPG may be used to generate the test vectors to cover the integrated circuit 10. When the number of untestable flops is less than the threshold number, the desired level of testability of the integrated circuit 10 may still be achieved. Accordingly, by excluding the identified flops from the ATPG program, testability goals may be reached without concern for the IVD issue/failure. In other embodiments, a combination of the corrective actions may be taken and/or only one type of action may be taken.

It is noted that there may be other uses for the vectorless methodology described herein. For example, after tapeout and receipt of corresponding hardware parts, a failure during scan testing may be detected. If IVD failure is suspected as a cause, the vectorless methodology may be used to simulate the state changes in the flops within a given area/block without the necessity of generating/simulating the full test vector.

Figure 5:
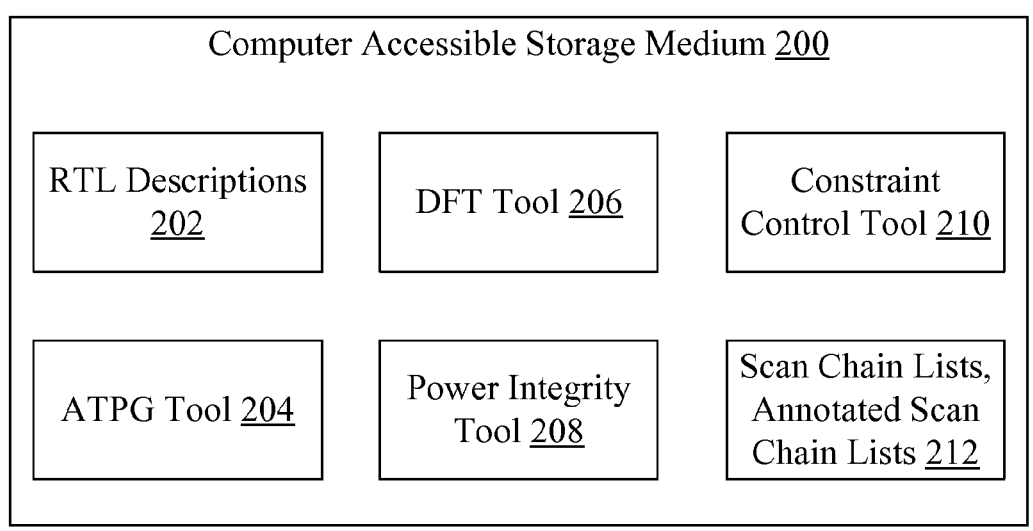
FIG. 5 is a block diagram of one embodiment of a computer accessible storage medium.

Turning now to FIG. 5, a block diagram of one embodiment of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB).

The computer accessible storage medium 200 in FIG. 5 may store one or more of RTL descriptions 202 (for blocks in the integrated circuit 10), ATPG tool 204, DFT tool 206, power integrity tool 208, constraint control tool 210, and scan chain lists and annotated scan chain lists 212. The ATPG tool 204 may include instructions which, when executed on a computer, implement the operation described for the ATPG tool above. Similarly, the DFT tool 206 may include instructions which, when executed on a computer, implement the operation described for the DFT tool above; the power integrity tool 208 may include instructions which, when executed on a computer, implement the operation described for the power integrity tool above; and the constraint control tool 210 include instructions which, when executed on a computer, implement the operation described for the constraint control tool above. The scan chain lists and annotated scan chain lists 212 may include the lists generated by the constraint control tool 210 as described above. A carrier medium may include computer accessible storage media as well as transmission media such as wired or wireless transmission.

Figure 6:
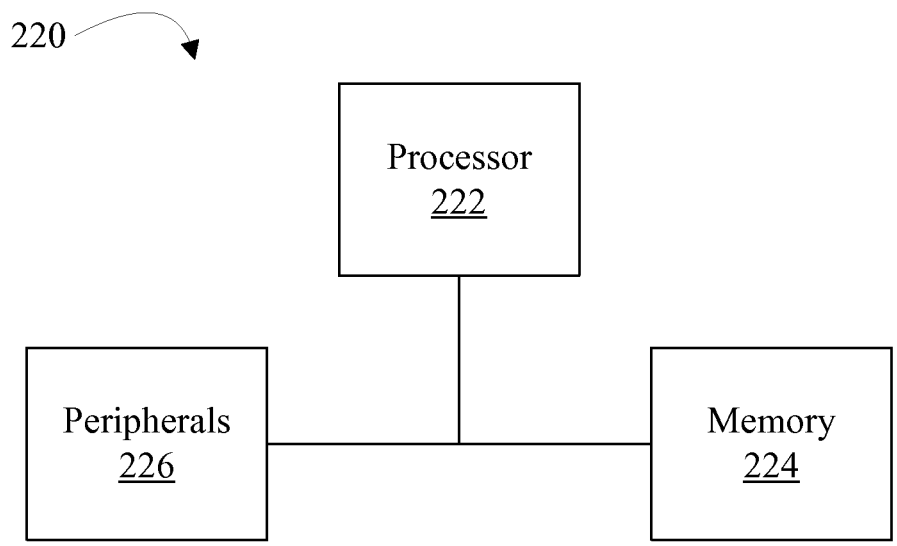
FIG. 6 is a block diagram of one embodiment of a computer system.

FIG. 6 is a block diagram of one embodiment of an exemplary computer system 220. In the embodiment of FIG. 6, the computer system 220 includes a processor 222, a memory 224, and various peripheral devices 226. The processor 222 is coupled to the memory 224 and the peripheral devices 226.

The processor 222 is configured to execute instructions, including the instructions in the software described herein such as the tools 204, 206, 208, and 210. In various embodiments, the processor 222 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, the computer system 220 may include more than one processor.

The processor 222 may be coupled to the memory 224 and the peripheral devices 226 in any desired fashion. For example, in some embodiments, the processor 222 may be coupled to the memory 224 and/or the peripheral devices 226 via various interconnect. Alternatively or in addition, one or more bridge chips may be used to coupled the processor 222, the memory 224, and the peripheral devices 226.

The memory 224 may comprise any type of memory system. For example, the memory 224 may comprise DRAM, and more particularly double data rate (DDR) SDRAM, RDRAM, low power DDR (LPDDR, LPDDR2, etc.), etc. A memory controller may be included to interface to the memory 224, and/or the processor 222 may include a memory controller. The memory 224 may store the instructions to be executed by the processor 222 during use, data to be operated upon by the processor 222 during use, etc.

Peripheral devices 226 may represent any sort of hardware devices that may be included in the computer system 220 or coupled thereto (e.g. storage devices, optionally including the computer accessible storage medium 200, other input/output (I/O) devices such as video hardware, audio hardware, user interface devices, networking hardware, etc.).

Numerous variations and modifications will become apparent to those skilled in the art once the above disclosure is fully appreciated. It is intended that the following claims be interpreted to embrace all such variations and modifications.

What is claimed is:

1. A method comprising:
   receiving a design description of an integrated circuit and a description of one or more scan chains in the integrated circuit, each scan chain comprising a serial connection of clocked storage devices, the serial connection formed by connecting scan in inputs and scan out outputs of the clocked storage devices;
   assigning probabilities to each possible state transition for each clocked storage device in the one or more scan chains based on a scan test pattern of alternating binary one and binary zero values, wherein the scan test pattern is serially shifted through the scan chains during a scan test using the serial connection;
   responsive to the probabilities and the design description, identifying instance voltage drop (IVD) failures the would occur during scan testing in the integrated circuit, wherein the IVD failures are identified prior to tapeout of the integrated circuit;
   identifying a plurality of clocked storage devices that experience the IVD failures; and
   excluding the plurality of clocked storage devices during scan test pattern generation by an automated test pattern generation tool.

2. The method as recited in claim 1 further comprising taking one or more corrective actions prior to tapeout to avoid at least one of the localized voltage drop failures.

3. The method as recited in claim 2 wherein the taking one or more corrective actions comprises modifying the integrated circuit design prior to the tapeout to avoid at least some of the IVD failures.

4. The method as recited in claim 2 wherein the taking one or more corrective actions comprises excluding one or more clocked storage devices that are affected by the localized voltage drop failure in an exception list for test vector generation.

5. The method as recited in claim 1 further comprising improving a power supply connection in an area of the integrated circuit that experiences the IVD failures.

6. The method as recited in claim 1 wherein excluding the plurality of clocked storage devices comprises generating a list of the plurality of clocked storage devices to be provided to the automated test pattern generation tool.

7. The method as recited in claim 1 further comprising performing scan test pattern generation by the automated test pattern generation tool, including excepting the one or more clocked storage devices from the test vectors.

8. The method as recited in claim 1 wherein the listing is responsive to a number of the one or more clocked storage devices being less than a threshold of a total number of clocked storage devices in the integrated circuit.

9. The method as recited in claim 1 wherein each of the clocked storage devices further includes a functional input and a functional output to coupled the clocked storage devices to combinatorial logic circuitry within the integrated circuit.

10. A computer accessible storage medium storing a plurality of instructions which, when executed:
   assign probabilities to each possible state transition for each clocked storage device in one or more scan chains of an integrated circuit based on a scan test pattern; and
   responsive to the probabilities and a design description of the integrated circuit, identify instance voltage drop (IVD) issues in the integrated circuit prior to tapeout of the integrated circuit;
   identify one or more clocked storage devices that are affected by the IVD issues; and
   exclude the identified clocked storage devices from scan test coverage to prevent IVD failure during scan testing, wherein excluding the identified clocked storage devices comprises generating a list of the identified clocked storage devices to be provided to an automated test pattern generation tool.

11. The computer accessible storage medium as recited in claim 10 further comprising a second plurality of instructions included in the automated test pattern generation tool which, when executed, perform test vector generation, including excepting the one or more clocked storage devices from the test vectors.

12. The computer accessible storage medium as recited in claim 10 wherein generating the listing is responsive to a number of the one or more clocked storage devices being less than a threshold of a total number of clocked storage devices in the integrated circuit.

* * * * *

UNITED STATES PATENT AND TRADEMARK OFFICE
CERTIFICATE OF CORRECTION

PATENT NO. : 8,413,102 B2
APPLICATION NO. : 13/197146
DATED : April 2, 2013
INVENTOR(S) : Wen-Chieh Jeffrey Yang It is certified that error appears in the above-identified patent and that said Letters Patent is hereby corrected as shown below:

In the Claims:

Claim 1, Column 9, Line 55, please delete "the" and substitute -- that --

Signed and Sealed this
Eleventh Day of June, 2013

Teresa Stanek Rea
*Acting Director of the United States Patent and Trademark Office*